United States Patent
Yoon

(12) 
(10) Patent No.: US 6,458,199 B1
(45) Date of Patent: Oct. 1, 2002

(54) CRYSTALLIZATION APPARATUS AND METHOD USING NON-VACUUM PROCESS

(75) Inventor: Jin Mo Yoon, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/578,681

(22) Filed: May 26, 2000

(30) Foreign Application Priority Data

May 28, 1999 (KR) .............................................. 99-19524

(51) Int. Cl.$^7$ ................................................. C30B 1/06
(52) U.S. Cl. ..................... 117/7; 117/8; 117/9; 117/200; 117/204
(58) Field of Search ............................ 117/7, 8, 9, 200, 117/204

(56) References Cited

U.S. PATENT DOCUMENTS

| | | | | |
|---|---|---|---|---|
| 5,612,250 A | * | 3/1997 | Ohtani et al. | 437/101 |
| 6,008,078 A | * | 12/1999 | Zhang | 438/164 |
| 6,124,154 A | * | 9/2000 | Miyasaka | 438/151 |
| 2001/0000243 A1 | * | 4/2001 | Sugano et al. | 438/166 |

* cited by examiner

*Primary Examiner*—Robert Kunemund
(74) *Attorney, Agent, or Firm*—Birch, Stewart, Kolasch & Birch, LLP

(57) ABSTRACT

A crystallization apparatus and method that is adapted to crystallize a semiconductor using a non-vacuum process. In the apparatus and method, laser beams are irradiated onto a substrate to grow a crystal unilaterally from the side surface of the substrate. Grain boundaries are minimized under the air atmosphere, so that a crystallization of the substrate can be made in a non-vacuum state to improve the throughput.

15 Claims, 8 Drawing Sheets

COVENTIONAL ART

COVENTIONAL ART

CRYSTALLIZATION APPARATUS AND METHOD USING NON-VACUUM PROCESS

BACKGROUND OF THE INVENTION

1. Field of the Invention

This invention relates to a crystallization apparatus and method for a semiconductor device, and more particularly to a crystallization apparatus and method for crystallizing a semiconductor using the non-vacuum process.

2. Description of the Related Art

Generally, a liquid crystal display (LCD) controls the light transmissivity of liquid crystal cells in accordance with video signals to display a picture corresponding to the video signals on a liquid crystal panel having the liquid crystal cells arranged in a matrix type. Such a LCD has used thin film transistors (TFTs) as switching devices for selecting pixel cells.

The TFT is classified into an amorphous silicon type and a poly silicon type depending upon whether a semiconductor layer is made from amorphous silicon or poly silicon. The amorphous silicon-type TFT has advantages of a relatively good uniformity and a stable character, whereas it has a drawback of low charge mobility. Also, it has a drawback in that, when the amorphous silicon-type TFT is used, peripheral driving circuits must be mounted onto a display panel after they were separately prepared. On the other hand, the poly silicon-type TFT has an advantage in that, since it has high charge mobility, it is easy to increase the pixel density and peripheral driving circuits can be directly mounted onto a display panel.

The formation of the poly silicon-type TFT is followed by a process of crystallizing an amorphous silicon substrate. In the crystallization process, a laser beam is irradiated mainly within a vacuum chamber so as to reduce a grain boundary.

Referring to FIG. 1 and FIG. 2, there is shown a conventional crystallization apparatus that includes a loadlock chamber 2 loaded with a glass substrate 9, a vacuum chamber 6 for crystallizing the glass substrate 9, and a transfer chamber 8 provided between the loadlock chamber 2 and the vacuum chamber to transfer a glass. A plurality of glass substrates 9 having been cleaned and dried is disposed within the loadlock chamber 2. The transfer chamber 8 is provided with a robot arm 4 that is rotary-driven to transfer the glass substrate 9. The vacuum chamber 6 irradiates laser beams onto the glass substrate 9 to crystallize it. The crystallization process will be described below. The glass substrate 9 transferred into the vacuum chamber 6 by means of the robot arm 4 and safely loaded on a stage 7 is provided with an amorphous semiconductor layer. Laser beams irradiated within the vacuum chamber 6 has a beam profile with Gaussian distribution characteristic as shown in FIG. 3, and are irradiated with being overlapped for the purpose of making a fair laser irradiation. When such laser beams are irradiated onto the glass substrate 9, the glass substrate 9 is changed into a polycrystalline structure by growing grains different in crystalline orientation from the lower surface of the glass substrate 9 while heating it by the laser beams and thereafter cooling it.

In the conventional crystallization apparatus, however, as grains different in crystalline orientation are exploded while the glass substrate 9 is heated by laser beams and then cooled, grain boundaries 9a are protruded between the grains as shown in FIG. 4. Assuming that a thickness of an amorphous semiconductor layer in the glass substrate 9 is 500 Å, the grain boundary 9a is protruded into a height of about ±100 Å. Such a grain boundary 9a not only causes the generation of a short between electrodes in the course of the process or upon completion of the TFT, but also it causes a crack of the glass substrate 9 by a thermal or physical impact. Accordingly, the crystallization is made within the vacuum chamber 6 maintaining a high vacuum degree so as to reduce the number of grain boundaries 9a or the protruded height of the grain boundaries 9a, but the grain boundaries 9a are not restrained at a satisfying level. Also, the crystallization apparatus of FIG. 1 and FIG. 2 has problems in that it may be contaminated in a process of transferring the glass substrate 9 by means of the robot arm 4, and that it is difficult to manage the vacuum degree of each chamber and it undergoes an excessive time waste whenever the glass substrate 9 is transferred by means of the robot arm 4. In other words, in FIG. 1 and FIG. 2, when the glass substrate 9 within the loadlock chamber 2 is moved into the transfer chamber 8, a gate valve 3 between the loadlock chamber 2 and the transfer chamber is opened or closed. When the glass substrate 9 is transferred into the vacuum chamber 6 by means of the robot arm 4, a gate valve between the transfer chamber 8 and the vacuum chamber 6 is opened or closed. The conventional crystallization apparatus requires a process of extracting an air from each chamber 2, 6 and 8 so as to keep the vacuum degree within each chamber 2, 6 and 8, particularly within the vacuum chamber 6 after each gate valve 3 and 5 was opened. The throughput is deteriorated due to such an opening or closing operation and such a vacuum degree management of the gate valves 3 and 5.

SUMMARY OF THE INVENTION

Accordingly, it is an object of the present invention to provide a crystallization apparatus and method using a non-vacuum process that is adapted to crystallize a semiconductor in a non-vacuum state.

A further object of the present invention is to provide to a crystallization apparatus and method using a non-vacuum process that is adapted to restrain grain boundaries.

In order to achieve these and other objects of the invention, a crystallization apparatus using a non-vacuum according to one aspect of the present invention includes crystallizing means for irradiating laser beams onto a substrate to grow a crystal unilaterally from the side surface of the substrate.

A crystallization method using a non-vacuum according to another aspect of the present invention includes the steps of irradiating laser beams onto a substrate to grow a crystal unilaterally from the side surface of the substrate.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
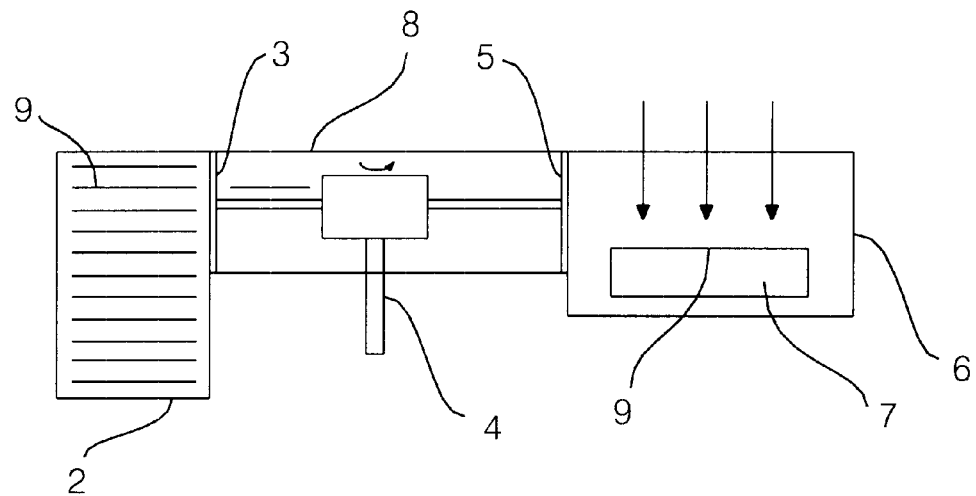
FIG. 1 is a schematic side view showing the structure of a conventional crystallization apparatus.
Figure 2:
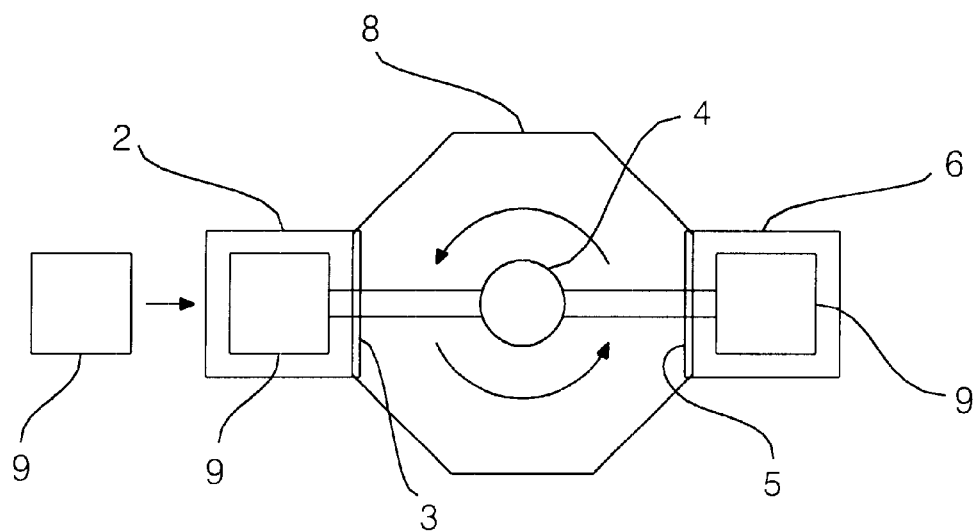
FIG. 2 is a plan view of the crystallization apparatus shown in FIG. 1.
Figure 3:
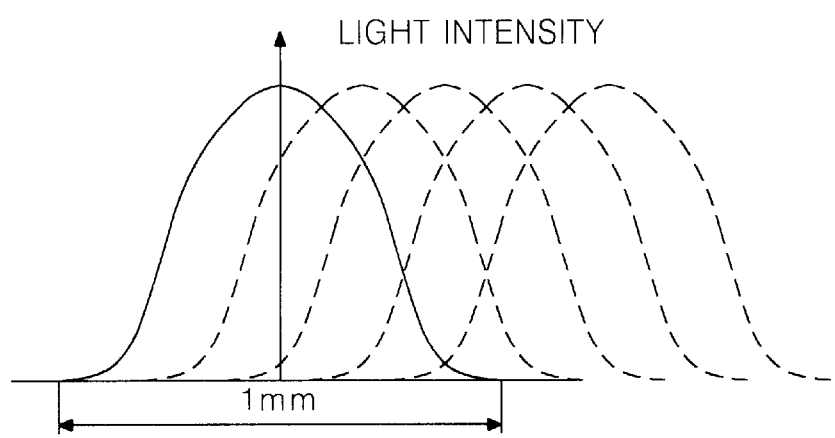
FIG. 3 is a characteristic graph of laser beams irradiated within the vacuum chamber in FIG. 1.
Figure 4:
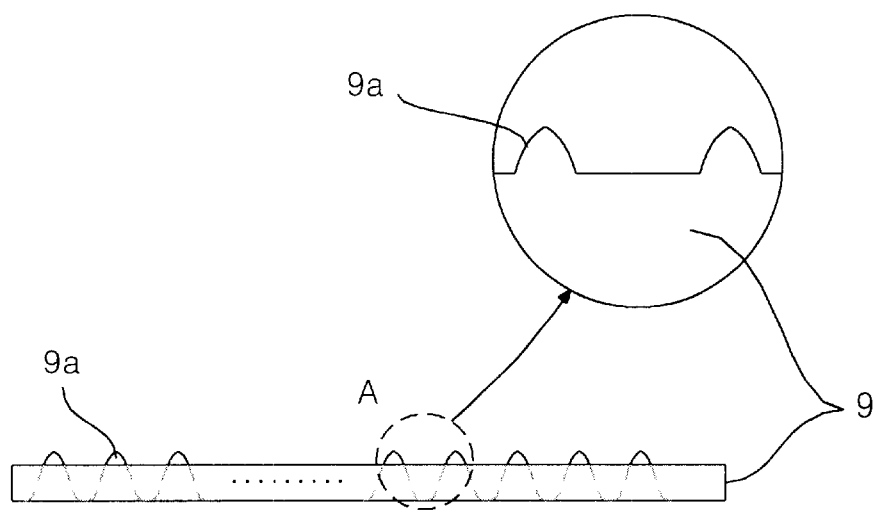
FIG. 4 is a section view showing grain boundaries formed on a substrate by means of the conventional crystallization apparatus.
Figure 5:
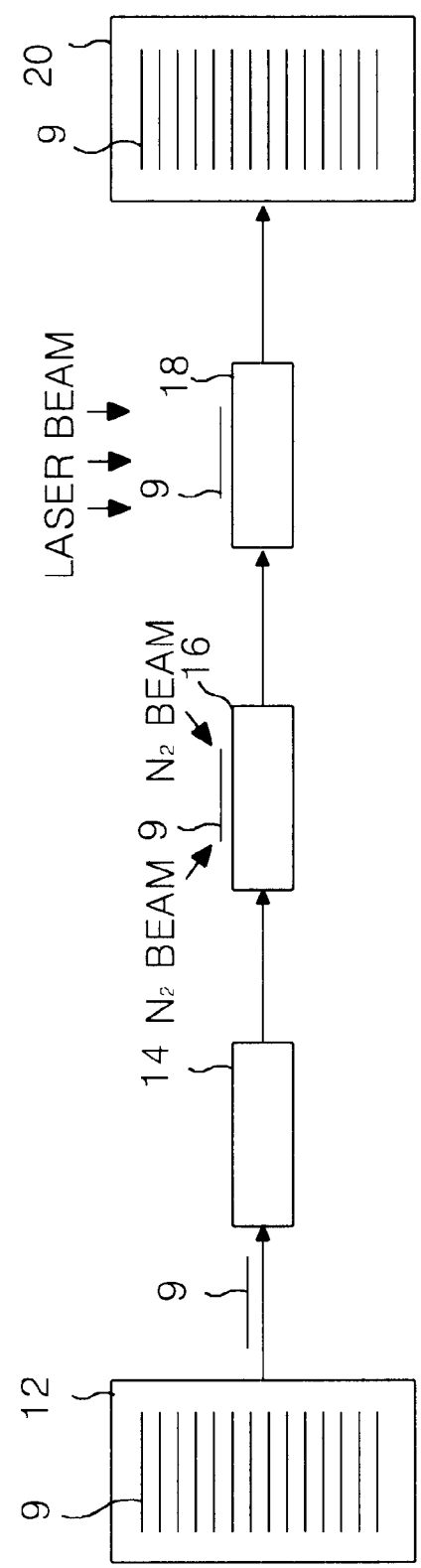
FIG. 5 is a schematic diagram showing the configuration of a crystallization apparatus according to a first embodiment of the present invention.
Figure 6:
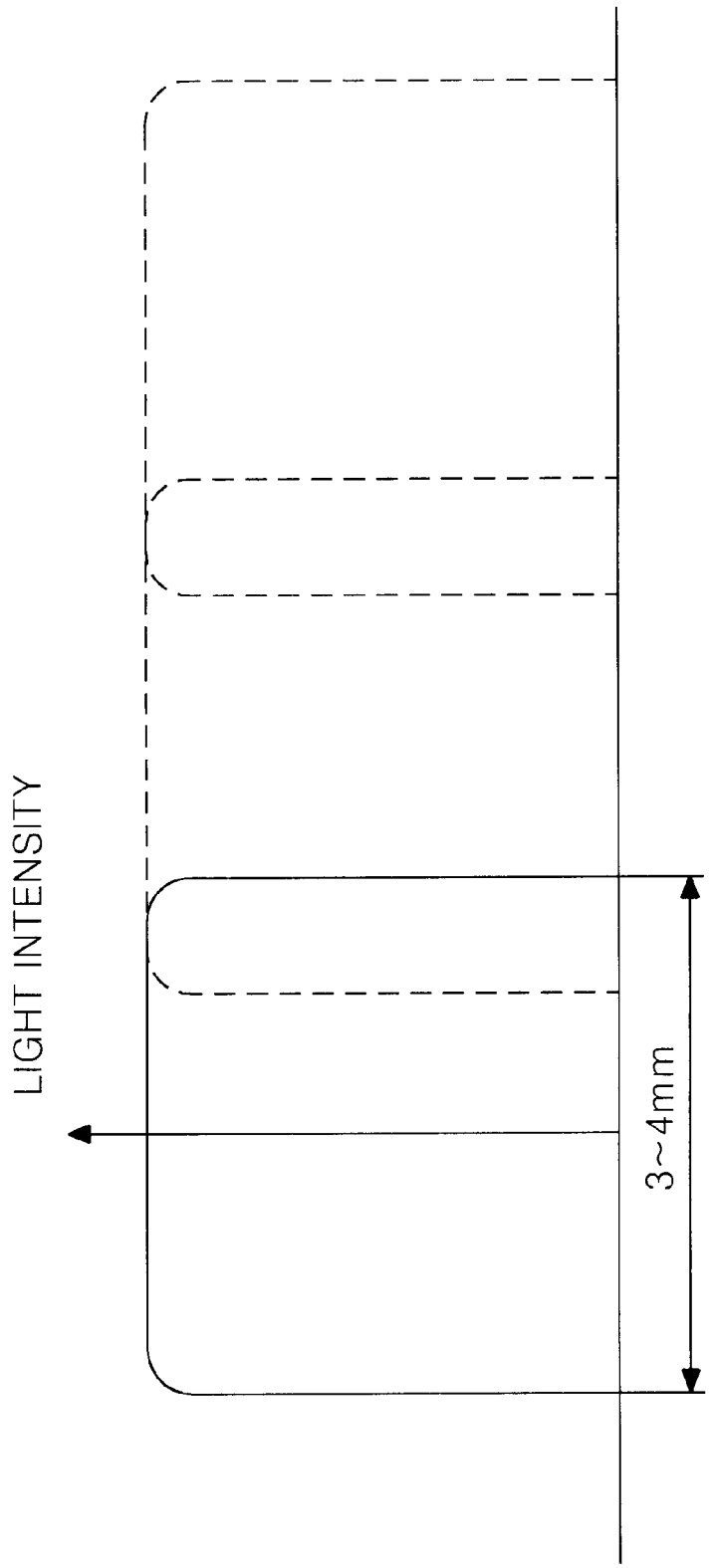
FIG. 6 is a characteristic graph of laser beams irradiated from the crystallization apparatus shown in FIG. 5.
Figure 7:
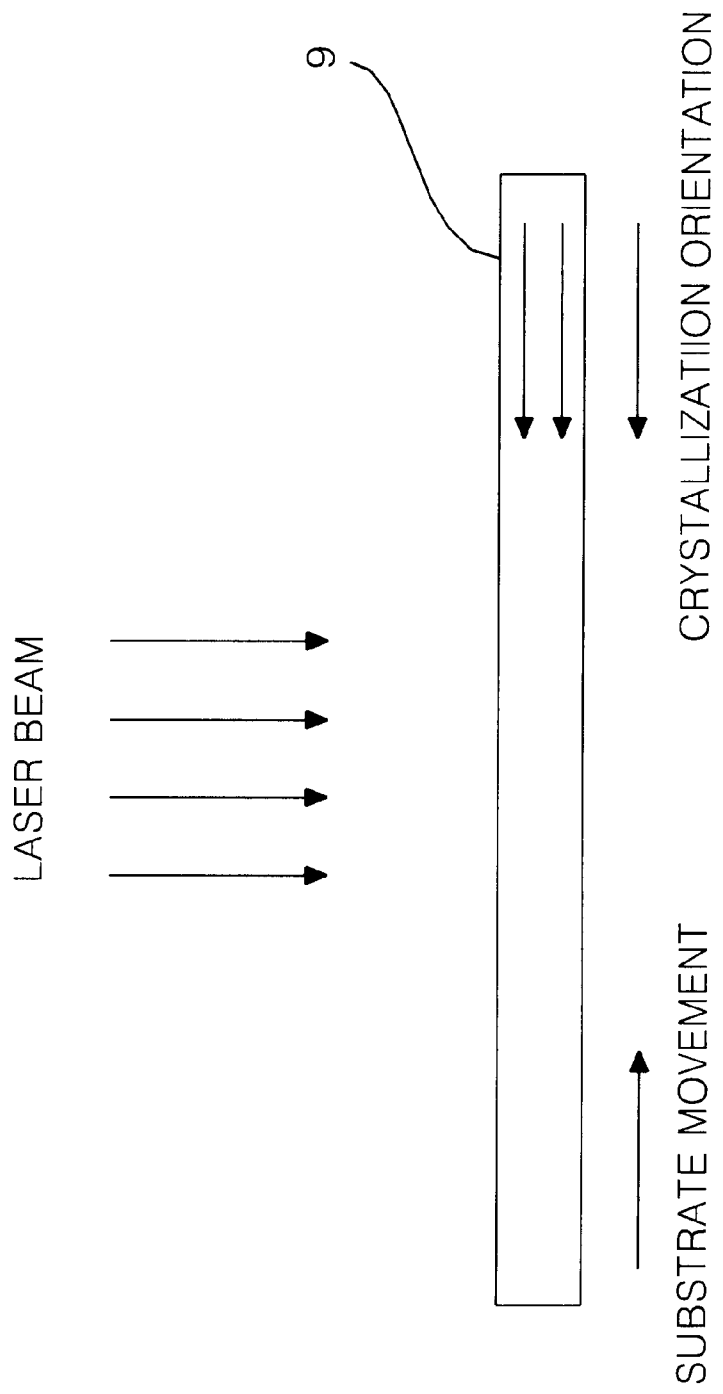
FIG. 7 is a section view for explaining the crystallization of an amorphous semiconductor layer on a substrate by laser beams having a characteristic shown in FIG. 6.

Referring to FIG. 5, there is shown a crystallization apparatus according to a first embodiment of the present invention. In the crystallization apparatus, a first substrate depositing device 12, a cleaner 14, a sequential lateral solidification (SLS) crystallizing device 18 and a second substrate depositing device 20 are arranged in an in-line type. A number of glass substrates 9 are disposed on the first substrate depositing device 12. The cleaner 14 jets a cleaning agent including HF onto the glass substrates 9 transferred from the first substrate depositing device 12 to clean the glass substrates 9. The drier 16 ventilates the cleaned glass substrates 9 using $N_2$ to dry it. The SLS crystallizing device 18 is non-vacuum crystallization equipment for crystallizing a glass substrate, and which crystallizes the glass substrates 9 by overlap-irradiating laser beams having a beam profile with a shape of rectangular wave thereon. More specifically, the SLS crystallizing device 18 overlap-irradiates the rectangular wave-shaped laser beams as shown in FIG. 6 onto the glass substrate 9 transferred from the drier 16. Then, while an amorphous semiconductor layer of the glass substrate 9 is heated by means of the laser beams and thereafter is cooled, a crystal is grown in a direction opposite to the moving direction of the substrate as shown in FIG. 7. As the crystallization is conducted at the beginning of the side surface of the substrate as described above, as the grain radius is increased, the number of grain boundaries is reduced, and the grain boundaries are not protruded in the vertical direction. The glass substrates 9 crystallized by means of the SLS crystallizing device 18 are transferred to the second substrate depositing device 29 and disposed.

The above-mentioned crystallization apparatus can reduce contamination of the glass substrate 9 because the cleaning and the crystallization are conducted by an in-line process. Also, the crystallization apparatus does not require the vacuum process, so that it is capable of reducing a cost involved in the vacuum chamber and the robot arm as well as shortening a time required from the cleaning process into the crystallization process to improve the throughput.

Figure 8:
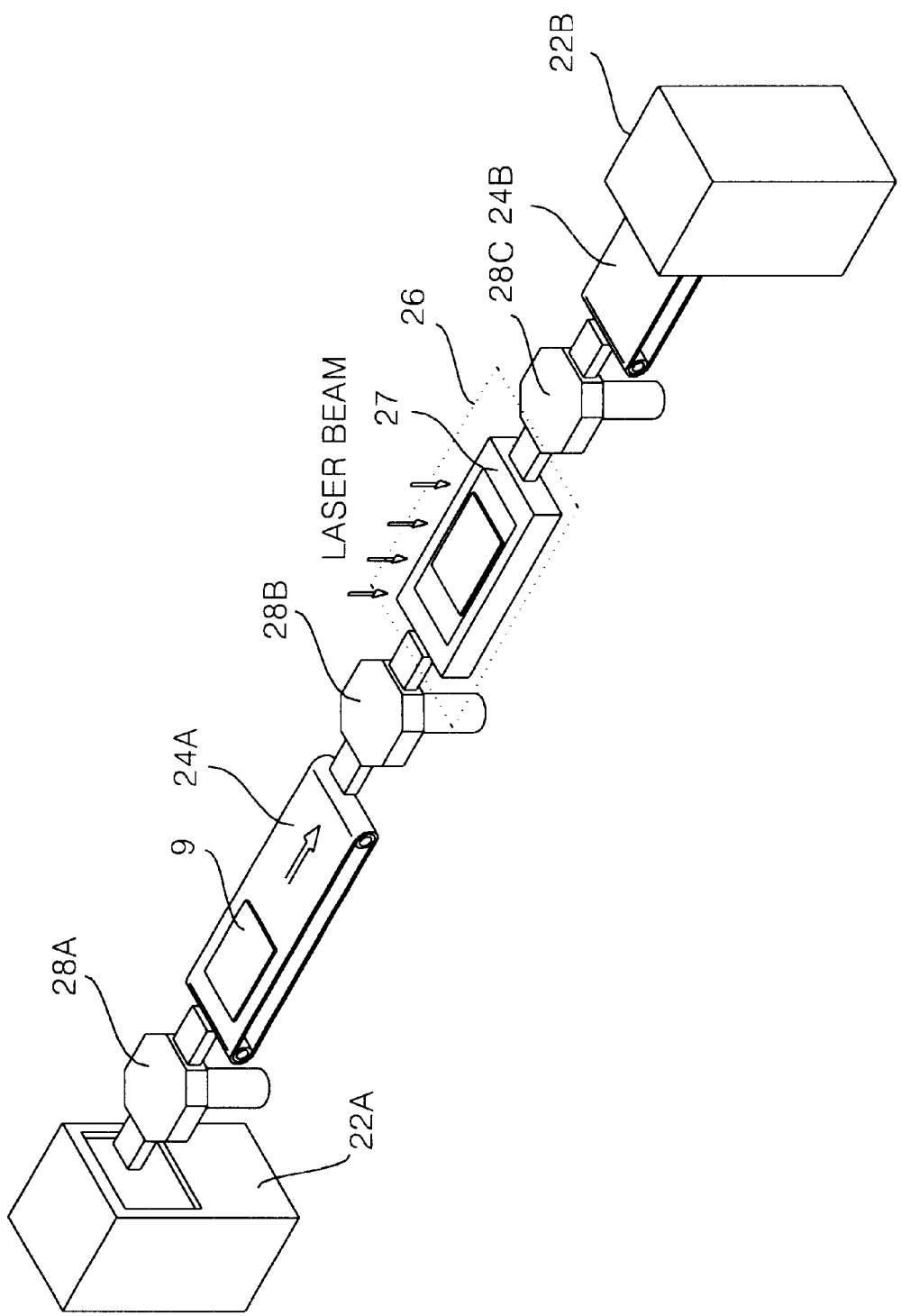
FIG. 8 is a perspective view showing the structure of a crystallization apparatus according to a second embodiment of the present invention.
Figure 9:
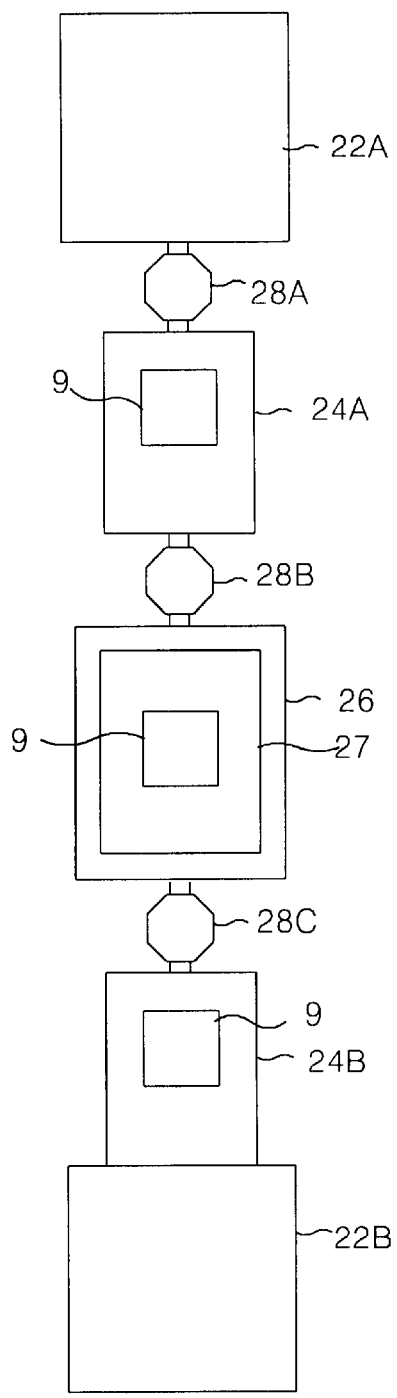
FIG. 9 is a plan view of the crystallization apparatus shown in FIG. 8.

Referring now to FIG. 8 and FIG. 9, there is shown a crystallization apparatus according to a second embodiment of the present invention. In the crystallization apparatus, a first conveyer belt 22A, a SLS crystallizing device 26 and a second conveyer belt 24B are arranged in an in-line type between a first substrate depositing device 22A and a second substrate depositing device 22B. A number of glass substrates 9 having been cleaned and dried are disposed on the first substrate depositing device 22A. The glass substrates 9 received in the first substrate depositing 22A are unloaded one by one by means of a first arm 28A and are safely loaded on the first conveyer belt 24A. The first conveyer belt 24A play a role to transfer the glass substrates 9 to the SLS crystallizing device 26. The glass substrates 9 transferred by means of the first conveyer belt 24A is safely loaded on a stage 27 of the SLS crystallizing device 26 by means of a second arm 28B. The SLS crystallizing device 26 is a non-vacuum crystallization equipment identical substantially to that in FIG. 5, and which irradiates laser beams onto the glass substrates 9 loaded on the stage 27 to crystallize an amorphous semiconductor layer of the glass substrate 9. Meanwhile, the SLS crystallizing device 26 may crystallize the glass substrates 9 under the $N_2$ atmosphere so as to reduce a contamination of the glass substrate 9. After the glass substrates 9 crystallized by means of the SLS crystallizing device 26 were safely loaded on the second conveyer belt 24B by means of a third arm 28C, they are transferred to the second substrate depositing device 22B by means of the second conveyer belt 24B and disposed in the second substrate depositing device 22B by turns.

Figure 10:
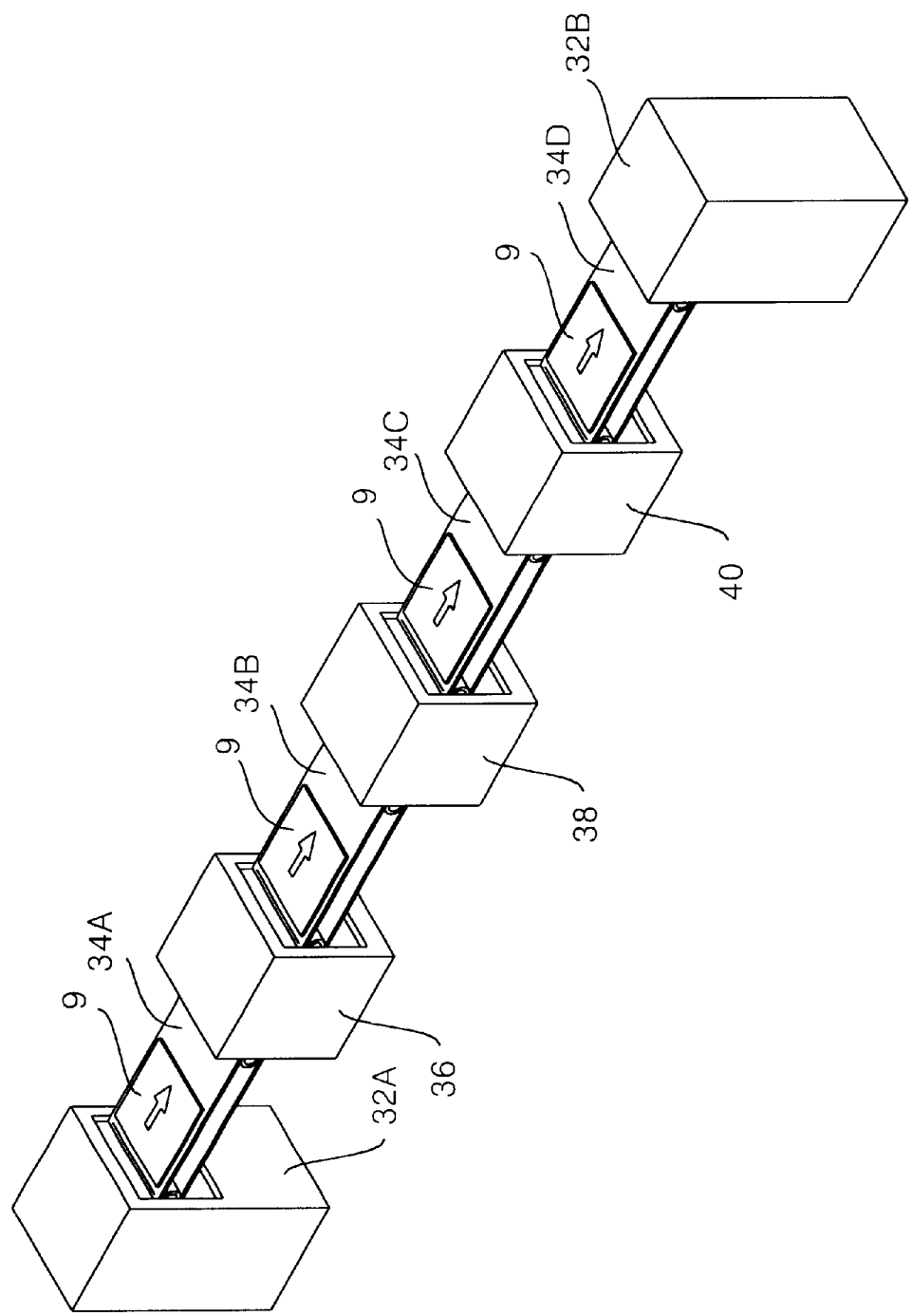
FIG. 10 is a perspective view showing the structure of a crystallization apparatus according to a third embodiment of the present invention.

Referring now to FIG. 10, there is shown a crystallization apparatus according to a third embodiment of the present invention. In the crystallization apparatus, a first conveyer belt 34A, a plasma enhanced chemical vapor deposition (PECVD) device 36, a second conveyer belt 34B, a cleaner/drier 38, a third conveyer belt 34C, a SLS crystallizing device 40 and a fourth conveyer belt 34D are arranged in an in-line type between a first substrate depositing device 32A and a second substrate depositing device 32B. A number of glass substrates 9, each of which is not provided with a crystalline layer, are disposed in the first substrate depositing device 32A. After the glass substrates 9 received in the first substrate depositing device 32A were unloaded one by one by means of an arm (not shown) to be safely loaded on the first conveyer belt 34A, they are transferred to the PECVD device 36 by means of the first conveyer belt 34A. The PECVD device 36 plays a role to deposit an amorphous semiconductor layer on the glass substrates 9 transferred by means of the first conveyer belt 34A and the arm. After the glass substrates 9 deposited with the amorphous semiconductor layer were transferred to the cleaner/drier 38 by means of the second conveyer belt 34B to be cleaned and dried, they are transferred to the SLS crystallizing device 40 by means of the third conveyer belt 34C. The SLS crystallizing device 40 irradiates laser beams onto the glass substrates 9 safely loaded on the stage under the air atmosphere or under the $N_2$ atmosphere to crystallize an amorphous semiconductor layer. The crystallized glass substrates 9 are transferred, via a fourth conveyer belt 34D, to the second substrate depositing device 32B and disposed in the second substrate depositing device 32B.

As described above, according to the present invention, the grain boundaries can be minimized even in an atmosphere state by utilizing the SLS crystallization method of growing a crystal in one direction from the side surface of the substrate, so that the glass substrate can be crystallized in a non-vacuum state. Also, the SLS crystallization method of growing a crystal in one direction from the side surface of the substrate is used to minimize the number of grain boundaries as well as the protrusion of grain boundaries. Moreover, since the vapor deposition equipment, the cleaner/drier, the loading equipment and the transfer equipment are arranged in an in-line type at the SLS crystallizing device, a contamination of the substrates can not only be reduced, but also a time required from the vapor deposition until the crystallization of the amorphous semiconductor layer can be dramatically reduced to improve the throughput.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A crystallization method using a non-vacuum, comprising the steps of:

disposing a number of catalyst-free substrates onto a first substrate depositing device;

transferring said substrates to a cleaner;

jetting a cleaning agent onto said substrates to clean said substrates;

transferring said substrates to a dryer;

drying said substrates by ventilating said substrates and using a non-reactive gas to dry them;

transferring said substrates to a laser beam generator;

irradiating laser beams onto said substrates under a non-vacuum to grow a crystal in a direction opposite to a transferring direction from the side surface of the substrates; and transferring said substrates to a second substrate depositing device.

2. The crystallization method according to claim 1, wherein the laser beams are irradiated onto the substrates under an air atmosphere.

3. The crystallization method according to claim 1, wherein the laser beams are irradiated onto the substrates under a nitrogen gas atmosphere.

4. The crystallization method according to claim 1, wherein the laser beams have a light intensity distribution with a shape of rectangular wave and are overlap-irradiated on the substrate.

5. The crystallization apparatus according to claim 1, further comprising the step of forming an amorphous semiconductor layer on the substrates.

6. A crystallization apparatus comprising:

a first substrate depositing device in which a substrate is placed for crystallization under a non-vacuum;

a cleaning means, for jetting a cleaning agent to clean said substrate;

a drying means, for ventilating and drying said substrate;

a laser beam generator associated with the crystallization apparatus for irradiating laser beams on a first surface of said substrate and growing a crystal laterally from a second surface of said substrate; and a second substrate depositing device in which said substrate is deposited.

7. The crystallization apparatus of claim 6, wherein a non-reactive gas is used for drying.

8. The crystallization apparatus of claim 6, wherein said non-reactive gas is a nitrogen gas.

9. The crystallization apparatus of claim 4, wherein the laser beams are overlap-irradiating laser beams.

10. The crystallization apparatus of claim 6, wherein the laser beam is used to grow a crystal in a direction opposite to a transferring direction of the substrate.

11. The crystallization apparatus of claim 6, wherein the crystallization device does not have a vacuum chamber.

12. The crystallization method of claim 1, wherein the step of irradiating laser beams onto the substrate includes irradiating over-lapping beams onto an upper surface of the substrate.

13. The crystallization apparatus according to claim 6, wherein the laser beams have a light intensity distribution with a shape of a rectangular wave and are overlap-irradiated on the substrate.

14. The crystallization apparatus according to claim 6, wherein a vapor deposition means is used for forming an amorphous semiconductor layer on the substrate, and said first substrate depositing device, said cleaning means, said drying means, said laser beam generator and said second substrate depositing device is arranged in an in-line process configuration.

15. The crystallization apparatus according to claim 14, further comprising:

first transfer means for transferring the substrate crystallized by the vapor deposition means to the cleaning/drying means; and second transfer means for transferring the substrate cleaned and dried by the cleaning/drying means to the crystallizing means.

* * * * *